(12) United States Patent
Sridevan

(10) Patent No.: US 7,166,890 B2
(45) Date of Patent: Jan. 23, 2007

(54) SUPERJUNCTION DEVICE WITH IMPROVED RUGGEDNESS

(76) Inventor: Srikant Sridevan, 2311 Matthews Ave., #A, Redondo Beach, CA (US) 90278

( * ) Notice: Subject to any disclaimer, the term of this patent is extended or adjusted under 35 U.S.C. 154(b) by 217 days.

(21) Appl. No.: 10/968,499

(22) Filed: Oct. 19, 2004

(65) Prior Publication Data
US 2005/0082570 A1 Apr. 21, 2005

Related U.S. Application Data

(60) Provisional application No. 60/513,174, filed on Oct. 21, 2003.

(51) Int. Cl.
H01L 29/76 (2006.01)
H01L 31/035 (2006.01)
H01L 31/336 (2006.01)

(52) U.S. Cl. .............. 257/328; 257/339; 257/653; 257/655; 438/247; 438/390; 438/268

(58) Field of Classification Search ........... 257/328, 257/339, 653, 655, 342, 329; 438/247, 390, 438/268
See application file for complete search history.

(56) References Cited

U.S. PATENT DOCUMENTS

| | | | |
|---|---|---|---|
| 6,040,600 A | 3/2000 | Uenishi et al. | |
| 6,353,252 B1 | 3/2002 | Yasuhara et al. | |
| 6,410,958 B1 * | 6/2002 | Usui et al. ............... | 257/329 |
| 6,509,240 B1 * | 1/2003 | Ren et al. ............... | 438/302 |
| 6,605,862 B1 | 8/2003 | Van Dalen et al. | |
| 6,674,126 B1 | 1/2004 | Iwamoto et al. | |
| 6,683,347 B1 * | 1/2004 | Fujihira ................... | 257/341 |
| 6,700,141 B1 | 3/2004 | Iwamoto et al. | |
| 6,713,813 B1 | 3/2004 | Marchant | |
| 6,740,931 B1 * | 5/2004 | Kouzuki et al. ........... | 257/341 |
| 6,762,455 B1 | 7/2004 | Oppermann et al. | |
| 6,764,906 B1 | 7/2004 | Darwish | |
| 6,768,170 B1 * | 7/2004 | Zhou ...................... | 257/341 |
| 6,828,609 B1 * | 12/2004 | Deboy et al. ............. | 257/285 |
| 6,849,900 B1 * | 2/2005 | Aida et al. ............... | 257/341 |
| 6,979,862 B1 * | 12/2005 | Henson .................... | 257/330 |
| 2001/0052601 A1 | 12/2001 | Onishi et al. | |
| 2002/0063281 A1 | 5/2002 | Tihanyl | |
| 2004/0150040 A1 | 8/2004 | Nitta et al. | |
| 2004/0245570 A1 * | 12/2004 | Ninomiya ................ | 257/330 |
| 2005/0082570 A1 * | 4/2005 | Sridevan ................. | 257/197 |

FOREIGN PATENT DOCUMENTS

DE 198 40 032 11/1999

* cited by examiner

Primary Examiner—Long Pham
Assistant Examiner—Shrinivas H. Rao

(57) ABSTRACT

An improved superjunction semiconductor device includes a charged balanced pylon in a body region, where a top of the pylon is large to create slight charge imbalance. A MOS-gated structure is formed over the top of the pylon and designed to conduct current through the pylon. By increasing a dimension of the top of the pylon, the resulting device is less susceptible to variations in manufacturing tolerances to obtain a good breakdown voltage and improved device ruggedness.

6 Claims, 2 Drawing Sheets

SUPERJUNCTION DEVICE WITH IMPROVED RUGGEDNESS

RELATED APPLICATION

The present application is based on and claims benefit of U.S. Provisional Application No. 60/513,174, filed Oct. 21, 2003, entitled Superjunction Device with Improved Ruggedness, to which a claim of priority is hereby made.

FIELD OF THE INVENTION

This invention relates to superjunction devices and a process for their manufacture, and more specifically to the increase of the ruggedness of superjunction devices, and the increase of the process window tolerances for such devices.

BACKGROUND OF THE INVENTION

Superjunction devices possess the advantage of significantly reduced $R_{dson}$ for the same high breakdown voltage (BV) of a conventional MOSFET. The superjunction is comprised of a multi-layer, for example, a six-layer sequence of implant and epitaxy to form spaced P-columns which is used to balance the charge in the N type drift region epi which receives the columns. The same reticle is used repetitively on the six layers to generate the P-column.

The charge balance is critical with a small process window. Exceeding this window on the P-type side (that is, having an excessive P charge in the P columns) leads to the BV falling below the spec. Exceeding this window on the N-type side leads to high BV but can lead to ruggedness reduction.

Device ruggedness can be enhanced by structural modifications that force the current to flow through the P-column rather than outside it. Such structures are shown in copending application Ser. No. 60/417,212, filed Oct. 8, 2002 and assigned to the assignee of the present invention, and which is incorporated herein by reference. In that case, the topmost portion only of the P columns had a higher and unbalanced P concentration (charge) than the remainder of the columns which have a balanced concentration against the surrounding N type body. This caused avalanche current at the top of the columns to be diverted from under the MOSFET source regions (the $R_b$' region) and toward the axis of the column.

BRIEF DESCRIPTION OF THE INVENTION

The invention proposes a different modification. Instead of using the same design for all the layers, the topmost layer design is modified with a slightly larger feature (diameter) and thus increased volume and P charge, solely in the active area such that the BV of the active area cells is reduced selectively and also so that the current flows into or toward the axis of the P column, thus improving the ruggedness. The lower 5 layers and the termination can then be optimized for maximum BV. The use of the separate upper or $6^{th}$ layer design will allow the realization of high termination BV, relatively lower active area BV and current flow in the P-column. The conjunction of these 3 factors will improve the ruggedness and increase the process window tolerance since it reduces the dependence of the EAS on the device BV. Note that while a six layer design has been chosen to illustrate the invention, any number of layers can be used.

DETAILED DESCRIPTION OF THE INVENTION

Figure 1:
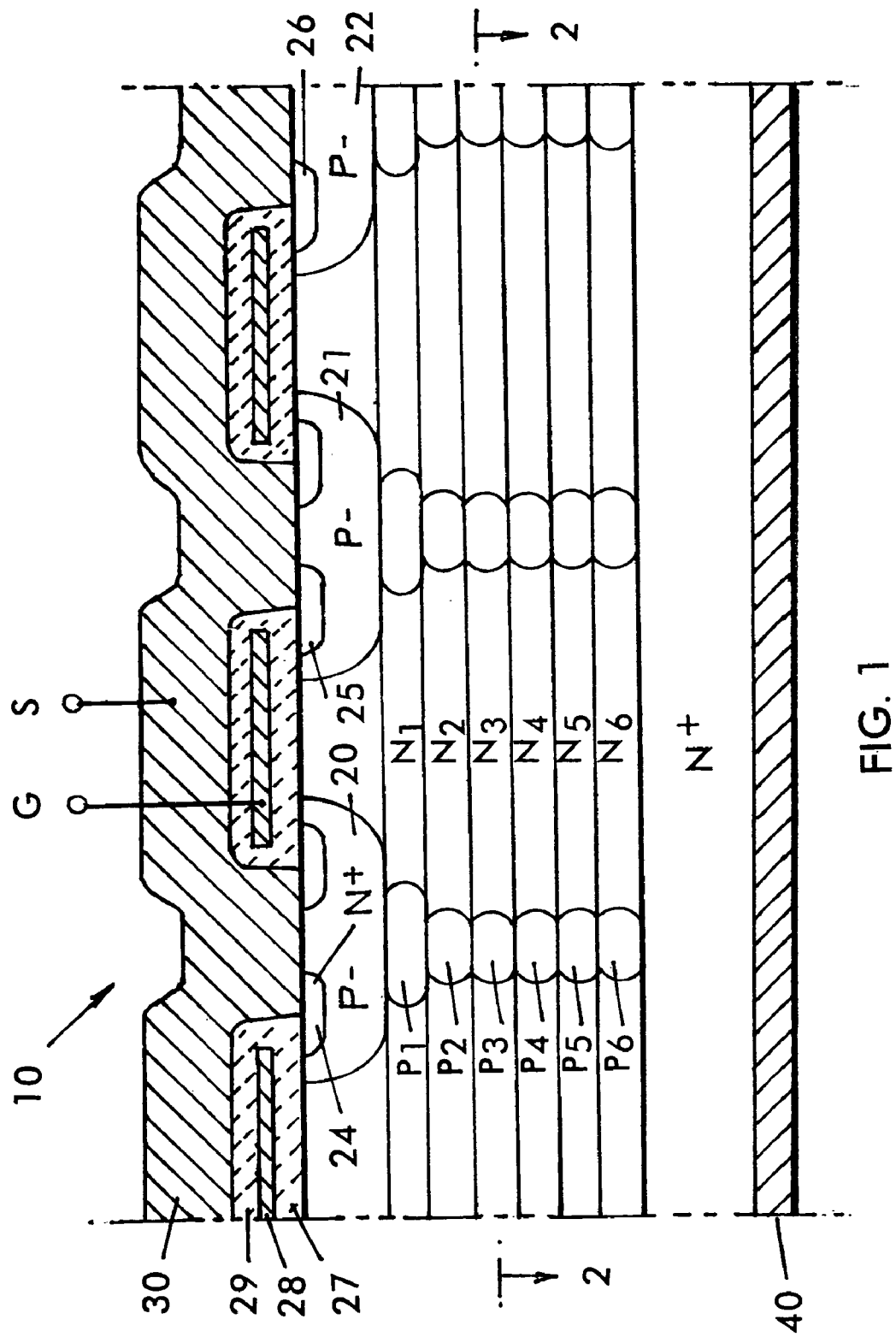
FIG. 1 is a cross-section of a small portion of the active area of a superjunction device which employs the present invention.
Figure 2:
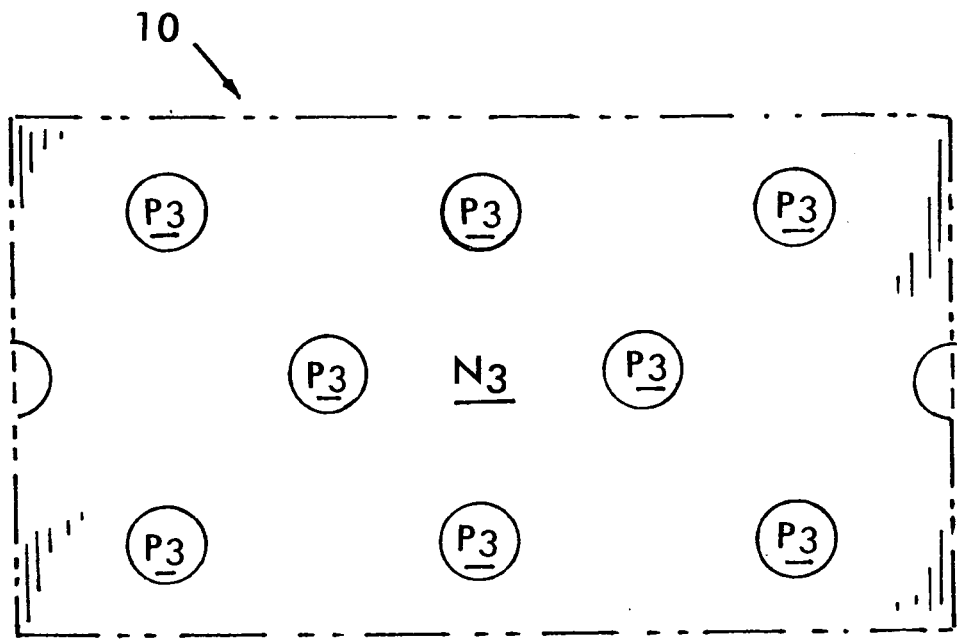
FIG. 2 is a cross-section of FIG. 1 taken across section line 2—2 in FIG. 1.
Figure 3:
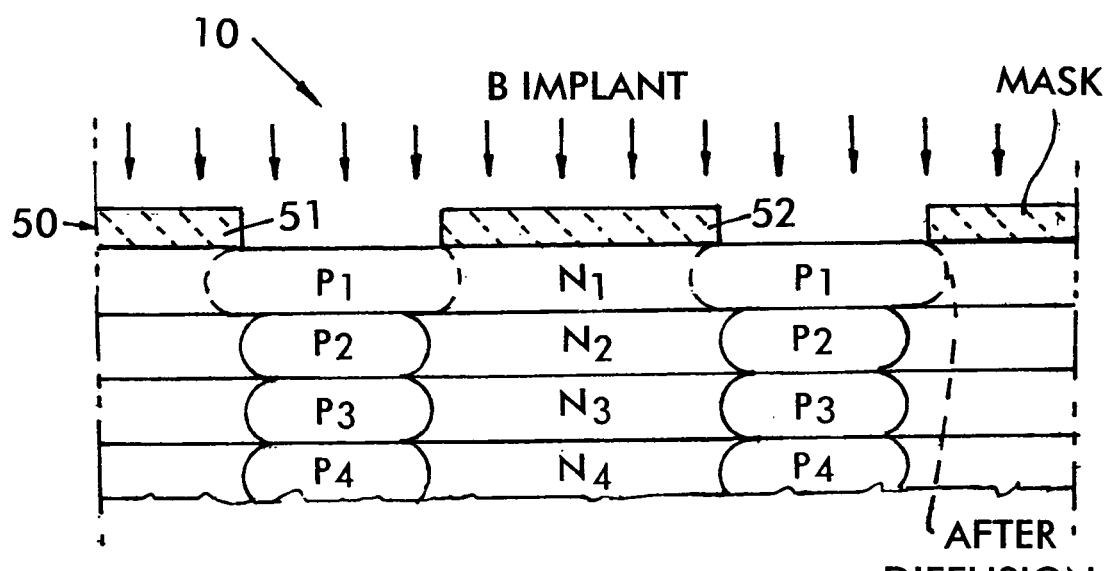
FIG. 3 shows the process step of forming an enlarged volume P section at the top of the P columns in accordance with the invention.

Referring to FIGS. 1 to 3, a silicon wafer (sometimes referred to as a die or chip) is formed of an N$^+$ wafer 10 which receives a series of epitaxial layers $N_6$ to $N_1$ which are sequentially formed. After the formation of each layer, an implant and diffusion is carried out to form P regions ($P_6$ to $P_1$ respectively). In the prior art, the implant and diffusions are identical in size and concentration and which are charge balanced to the surrounding charge of layers $N_6$ to $N_1$ respectively, which are each of the same concentrations.

Each of P regions $P_6$ to $P_1$ are aligned to one another to form a continuous column or "pylon".

A MOSgated structure is then formed atop each column, shown in FIG. 1 as P channel regions 20, 21 and 22 which conventionally receive N$^+$ source regions 24, 25 and 26 respectively. A gate oxide 27 is deposited over the inversion areas of each of channel regions 20, 21 and 26 respectively and a conductive polysilicon gate 28 is formed over each of gate oxide regions 27. An LTO insulation layer 29 is formed over gates 28 and a source electrode 30 is formed over the layer 29 and contacts each of sources 24, 25, 26 and the inner channel of regions 20, 21 and 22. Note that the channel regions 20, 21 and 22 may be polygonal cells or stripes; and columns $P_6$ to $P_1$ have corresponding circular or stripe shapes. A drain electrode 40 is attached to the bottom of N$^+$ region 10.

In accordance with the invention, the uppermost P regions $P_1$ have a greater diameter then that of the underlying regions $P_2$ to $P_6$, so that the top of the columns will have a greater P charge than that of the surrounding $N_1$ layer. The top-most column may have an increased diameter of only a few percent over that of the lower columns. By way of example, if the lower column elements $P_2$ to $P_6$ have a diameter, after diffusion of 5 microns, the top P region $P_1$ may have a diameter of 5.1 microns (2% greater) to obtain the benefits of the invention.

FIG. 3 shows the implant and diffusion of the top P region $P_1$. Thus, the layer $N_1$ is deposited atop layer $N_2$ and its P regions $P_2$. A mask 50 is then formed atop layer $N_1$ with windows 51, 52 aligned with the center of region $P_2$. A boron or other P species implant and diffusion is then carried out to form the enlarged diameter regions $P_1$ aligned to the tops of the P columns. However, the window diameter for windows 51 and 52 are larger than the implant windows in the mask for regions $P_2$ to $P_6$, creating the enlarged diameter top region $P_1$. Alternately, the diffusion process is carried out for a longer period of time to form enlarged regions $P_1$.

While the windows 51 and 52 are circular (FIG. 2), other shapes can be used for windows 51 and 52, such as elongated stripes, rectangles, ovals, or circles with projecting fingers, and the like to produce a larger P volume at the top of each column. In addition, regions $P_1$ need not be formed on every column over region $P_2$. Some column may include a $P_1$ region that is the same size as region $P_2$ or other regions in the P columns. These columns may be interspersed throughout the semiconductor device to obtain particular characteristics for the device.

Further, while the description above contemplates identical diameters (or widths) for P regions $P_2$ to $P_6$, they may be continuously tapered or stepped down in diameter from a larger diameter for regions $P_2$ to a smaller diameter for regions $P_6$. In addition, a number of upper P regions may be enlarged to some extent, and be in charge imbalance with the surrounding N type material. For example, the topmost two or three P regions may be enlarged in comparison to the lower P regions, and be in charge imbalance with the surrounding N type material.

Although the present invention has been described in relation to particular embodiments thereof, many other variations and modifications and other uses will become apparent to those skilled in the art. It is preferred, therefore, that the present invention be limited not by the specific disclosure herein.

What is claimed is:

1. A superjunction semiconductor device, comprising:
    a semiconductor body region having a first conductivity of N-type;
    a plurality of layers, each layer comprising a plurality of vertically aligned regions forming spaced pylons having a second conductivity of P-type extending along a portion of a thickness of the body region, a distance between two adjacent pylons is larger than a width of the pylon;
    each of the pylons having a MOSgated structure with a source region disclosed in a channel region positioned above and in contact with the pylon;
    a majority portion of each of the pylons being in a charged balance with the body region surrounding the pylon; and
    a top portion of the pylon near the MOSgated structure having a dimension approximately 2% greater than that of a remainder of the pylon, wherein the top portion of the pylon is out of charge balance with the surrounding body region.

2. The device according to claim 1, wherein the pylon has a substantially cylindrical shape.

3. The device according to claim 2, wherein the top portion has a larger diameter than the remaining portion.

4. The device according to claim 3, wherein the top portion has a dimension 2% greater than that of the remainder portion of the pylon.

5. A superjunction device having improved avalanche capability, comprising:
    a semiconductor wafer body of a first conductivity type and having a major electrode on a bottom of the wafer;
    a plurality of layers, each layer comprising a plurality of vertically aligned regions forming spaced pylons of a second conductivity type extending through at least a portion of a thickness of the wafer, wherein the space between two adjacent pylons is larger than a width of the pylon;
    the lower portions of the pylons being in charged balance with the wafer body; and
    a portion of a top of the pylons having a dimension approximately 2% greater than that of the lower portions of the pylons, wherein the top portion is in charge imbalance with the wafer body.

6. The device according to claim 5, further comprising:
    a MOSgated structure disposed at a top of each of the pylons;
    the MOSgated structure including a channel region of the opposite conductivity type extending across and overlapping a corresponding pylon;
    a respective source region of the one conductivity type extending into each channel region;
    a gate structure extending across respective invertible channel regions between a source and channel regions at a top of the wafer; and
    a source electrode extending over a top of the wafer and in contact with each of the source and channel regions.

* * * * *

UNITED STATES PATENT AND TRADEMARK OFFICE
CERTIFICATE OF CORRECTION

PATENT NO. : 7,166,890 B2 Page 1 of 1
APPLICATION NO. : 10/968499
DATED : January 23, 2007
INVENTOR(S) : Srikant Sridevan It is certified that error appears in the above-identified patent and that said Letters Patent is hereby corrected as shown below:

IN THE CLAIMS:

In claim 1 (column 3 , line 31), change "disclosed" to --disposed--.

Signed and Sealed this

Tenth Day of April, 2007

JON W. DUDAS
*Director of the United States Patent and Trademark Office*